United States Patent [19]
Kim et al.

[11] Patent Number: 6,057,970
[45] Date of Patent: May 2, 2000

[54] APPARATUS FOR ENHANCING DEPTH OF FOCUS USING BIREFRINGENT MATERIAL

[75] Inventors: Doh Hoon Kim; Kag Hyeon Lee; Sang Soo Choi; Hai Bin Chung; Bo Woo Kim, all of Daejeon, Rep. of Korea

[73] Assignee: Electronics and Telecommunications Research Institute, Daejeon, Rep. of Korea

[21] Appl. No.: 09/161,426

[22] Filed: Sep. 24, 1998

[30] Foreign Application Priority Data

May 28, 1998 [KR] Rep. of Korea ...................... 98-19516

[51] Int. Cl.[7] .............................. G02B 3/10; G03F 9/00; G21K 5/10
[52] U.S. Cl. .......................... 359/721; 430/5; 250/492.22
[58] Field of Search ........................... 250/492.1, 492.22; 356/401; 378/34; 438/468, 535, 508, 553, 554–559; 427/457; 148/224; 430/5, 311, 322, 323, 324, 314, 22, 315; 359/342, 350, 618, 399, 639, 361, 719, 642, 737, 721, 739

[56] References Cited

U.S. PATENT DOCUMENTS

| | | | |
|---|---|---|---|
| 3,990,798 | 11/1976 | White | 356/172 |
| 4,981,342 | 1/1991 | Fiala | 350/403 |
| 5,142,411 | 8/1992 | Fiala | 359/494 |
| 5,410,375 | 4/1995 | Fiala | 351/168 |
| 5,671,034 | 9/1997 | May et al. | 349/200 |
| 5,712,721 | 1/1998 | Large | 359/245 |
| 5,905,708 | 5/1999 | Richter | 369/112 |

OTHER PUBLICATIONS

A.M. Goethals, "Top surface imaging and Optical Proximity Correction: A way to 0.18 μm lithography at 248 nm", SPIE vol. 2726, pp. 362–374, (1996).

Hiroshi Fukuda et al., "A New Method for Enhancing Focus Latitude in Optical Lithography: FLEX", IEEE Electron Device Letters, vol. EDL–8, No. 4, Apr. 1987.

Marc D. Levenson, et al., "Improving Resolution in Photolithography with a Phase–Shifting Mask", 1982 IEEE, pp. 1828–1836.

*Primary Examiner*—Georgia Epps
*Assistant Examiner*—David N. Spector
*Attorney, Agent, or Firm*—Jacobson, Price, Holman & Stern, PLLC

[57] ABSTRACT

The present invention relates to an apparatus for forming fine patterns in semiconductor devices, display devices and micro-electro-mechanical systems and more particularly to an image projecting system using an optical component, which is made of birefringent material, in the lithography techniques. The lithography apparatus according to the present invention comprises an optical lens system in which an image of a photomask is transferred to an object by a light source, wherein said optical lens system comprises a plurality of isotropic optical unit and at least one birefringent optical unit, said birefringent optical unit including at least one of said birefringent optical components.

10 Claims, 6 Drawing Sheets

APPARATUS FOR ENHANCING DEPTH OF FOCUS USING BIREFRINGENT MATERIAL

BACKGROUND OF THE INVENTION

1. Field of the Invention

The present invention relates to an apparatus for forming fine patterns in semiconductor devices, display devices and micro-electro-mechanical systems and more particularly to an image projecting system using an optical component, which is made of birefringent material, in the lithography techniques.

2. Description of the Related Art

Generally, a photoresist film has been used as a photosensitive material in lithography processes. A conventional photosensitive material for a camera is shown in FIG. 1A, wherein the remaining photosensitive material after the development has a characteristic to increase in density as the intensity of the illumination increases. Accordingly, when an image is formed on a film by a lens system such as a camera, the contrast of the image depreciates. In photosensitive material used in lithography processes, the density of the material remains substantially unchanged changed within a restricted region even if light intensity increases. However, its density may dramatically increase at the light intensity increases over a critical value, as shown in FIG. 1B. Accordingly, when an image is formed on this photosensitive material, the boundary between a photosensitive material region and a non-photosensitive material region is remarkable because of the high contrast on the image. These characteristics enhance the resolution of the patterns to be used in semiconductor devices and display devices.

In the conventional lithography apparatus, after an image is converged into a point through an optical lens system, the image is spread out again. In this case, the light intensity is weak with the spread of image so that the photosensitive material can not be sensitized below a predetermined light intensity. Although the illumination has a light intensity capable of sensitizing the photosensitive material, the desired resolution can not be obtained on the photosensitive material when the image is spread out in the direction of the axis of the optical lens system according to the intensity of the spread light. In view of these two features, the range of image projection which satisfies a desired resolution is called the "depth of focus." Since the depth of focus is in proportion to the wavelength of light and in inverse proportion to the square of the numeral aperture (NA) which indicates the relative size of the optical lens system, the margin of the depth of focus becomes narrower with the short wavelength of light, thereby reducing the yield.

FIGS. 2A and 2B are schematic diagrams showing the characteristics of isotropic optical components in a conventional optical lens system, wherein the isotropic optical components have the same refractive index. The isotropic optical component 110 (FIG. 2A) made of an isotropic material or an isotropic optical unit 100 (FIG. 2B) consisting of the isotropic optical component 110 form an image point 115 along the optical axis 1 of the optical lens system, irrespective of an one-directional linear polarization 112 or a vertical linear polarization 113 vertical to the one-directional linear polarization 112. The light converged into the image point 115 is spread out after passing through the image point 115. Accordingly, the image can be obtained within a limited region taken along the axis, which has the intensity required to sensitize the photosensitive material, and this limited region is also called the depth of focus 117.

The isotropic optical component 110 or the isotropic optical unit 100 has a low resolution because the depth of focus 117 in order to have a needed resolution is narrow. To achieve the margin of the desired depth of focus, the conventional lithography process has used a photosensitive material of which only the surface is sensitized or used a mechanical method which moves a wafer along the optical axis using an upward or downward moving stage in order that several exposure processes are carried out for extending the depth of focus. Also, the depth of focus has been extended by attenuating the cone caused by the light flux converged into the image point and by fabricating a photomask with a phase-shifting material which provides phase difference between the patterns.

The first method of the conventional techniques needs the additional process for changing the characteristics of the photosensitive film and a special material is needed to form such a photoresist film. Therefore, it has the problem in that the process becomes more complicated and the manufacturing cost is increased.

The second method of the conventional techniques has merit in that the conventional process and photosensitive material are used. However, it also has the problem in that the exposure must be performed several times with the movement of the wafer in the direction of the axis of the optical lens system, therefore, the optical lens system is not stable during the wafer movement. As a result, it needs a long process time because the expose must be performed several times. Moreover, as the area to be exposed is extended, the exposing method is changed to one in which the stage moves horizontal direction with exposure so that the second method can not be used any more. Also, the third method of the conventional technique has a lot of problems in that it is very difficult to fabricate the needed photomask and the image produced by such a photomask is unsymmetrical in the cone type light flux of light converged to an focusing point so that a lot of aberration may occur.

SUMMARY OF THE INVENTION

Therefore, the present invention has been made in view of the above-mentioned problems, and an object of the present invention is to provide an apparatus extending the depth of focus in the lithography process using common photosensitive material.

Another object of the present invention is to provide an apparatus extending the depth of focus in a common photomask and an optical lens system.

In accordance with an aspect of the present invention, there is disclosed a lithography apparatus comprising: an optical lens system in which an image of a photomask is transferred to an object by a light source, wherein said optical lens system comprises a plurality of isotropic optical unit; and at least one birefringent optical unit, said birefringent optical unit including at lease one of said birefringent optical component.

The light source according to the present invention uses a polarized light having a polarization direction at an angle of 45 degrees to the direction of the axis of said birefringent component so that a plurality of foci are formed along the axis of the optical lens system.

BRIEF DESCRIPTION OF THE DRAWINGS

A further understanding of the nature and advantage of the present invention will become apparent by reference to the remaining portions of the specification and drawings, in which.

DETAILED DESCRIPTION OF THE PREFERRED EMBODIMENT

A detailed description of an embodiment according to the present invention will be given below with reference to the attached drawings.

Figure 1A:
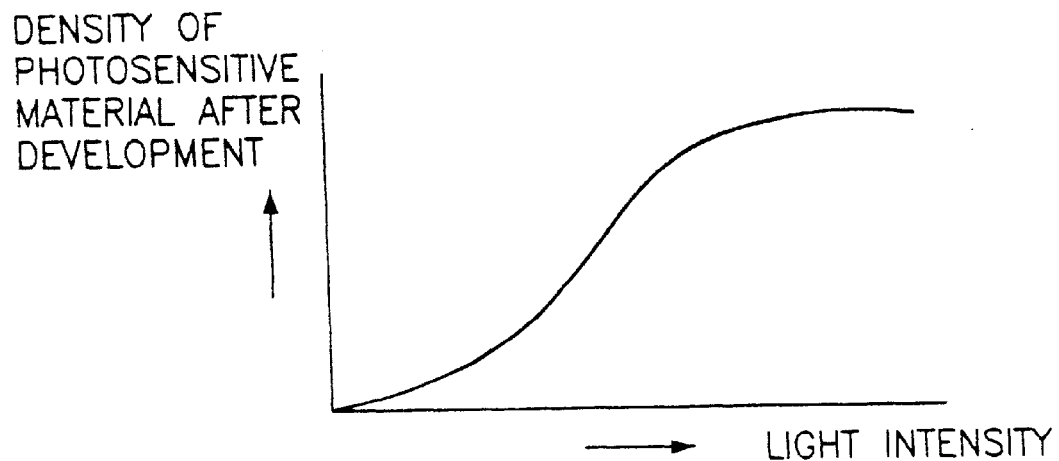
FIG. 1A is a graph showing the characteristics of a normal photosensitive material.
Figure 1B:
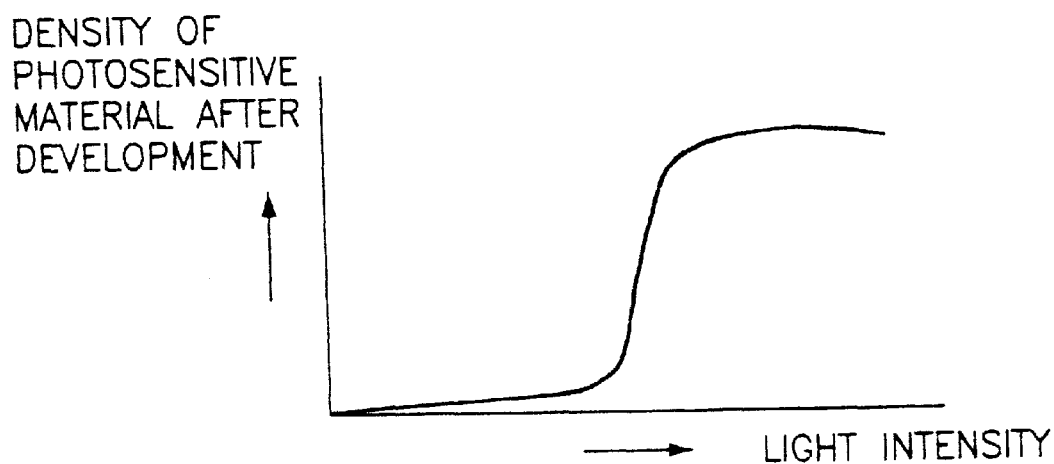
FIG. 1B is a graph showing the characteristics of a photoresist used in lithography process.
Figure 2A:
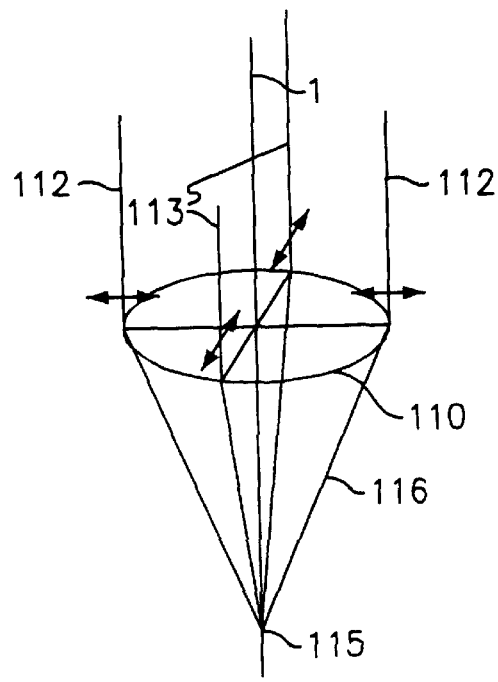
FIG. 2A is a schematic diagram illustrating the characteristics of an isotropic optical component in a conventional optical lens system.
Figure 2B:
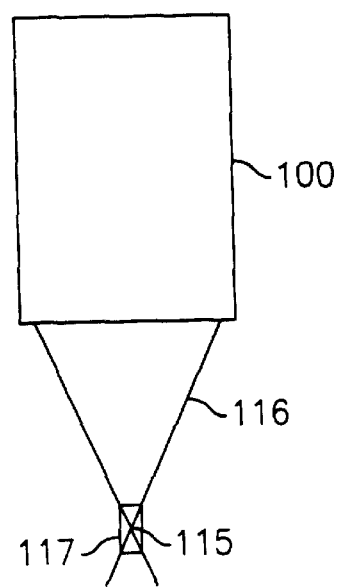
FIG. 2B is a schematic diagram illustrating the characteristics of an isotropic optical unit in a conventional optical lens system.
Figure 3:
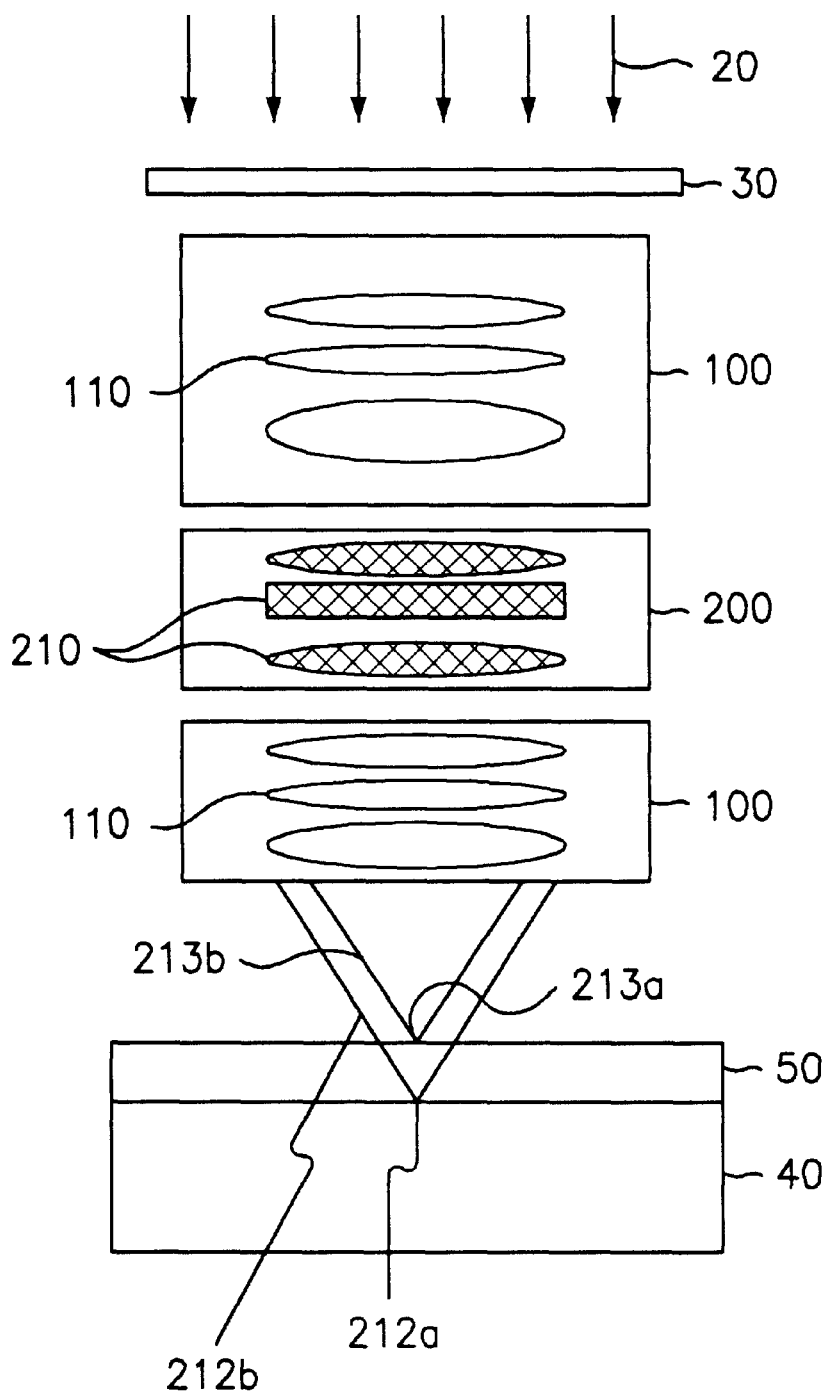
FIG. 3 is a schematic diagram illustrating an embodiment of the present invention.

FIG. 3 shown an optical lens system used in a lithography apparatus according to an embodiment of the present invention. The optical lens system includes a light source 20, a mask 30 and a birefringent optical unit 200 which includes birefringent optical components 210 made of birefringent materials. The depth of focus is increased by the birefringent optical unit 200 which allows the incident light to be resolved into a predetermined number of polarization components and focused at different locations (213a and 212a). The birefringent material may be one of crystal, calcite, mica or birefringent polymer.

The birefringent optical unit 200 includes birefringent optical components, such as parallel plate, lens, prism and optical wedge. The birefringent optical unit 200 is used to separate the light paths according to the differences of refractive indices of the polarization components of the light from the light source 20. Further, the separated light paths are respectively focused on different locations taken along to the axis of the optical lens system. Therefore, the resolution of the lithography apparatus is enhanced.

Figure 4A:
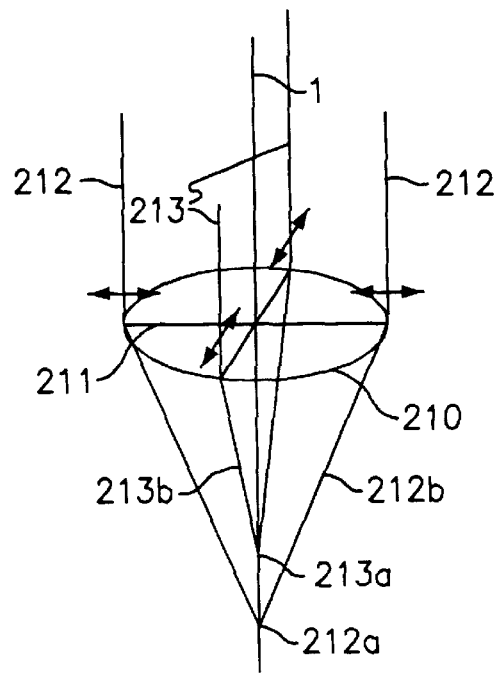
FIG. 4A is a schematic diagram illustrating the characteristics of a birefringent optical component according to the present invention.
Figure 4B:
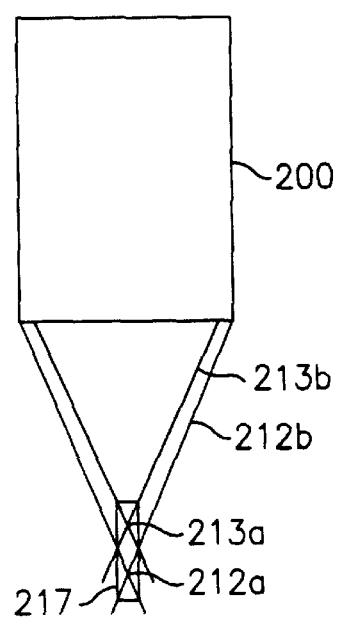
FIG. 4B is a schematic diagram illustrating the characteristics of a birefringent optical unit according to the present invention.

FIGS. 4A and 4B show the characteristics of birefringent optical components 210 and a birefringent optical unit 200 according to the present invention. As shown in FIGS. 4A and 4B, since the refractive index of a light component 212 having a parallel polarization to an axis 211 of the birefringent material is different from that of a light component 213 having a perpendicular polarization to the axis 211 of the birefringent material, the focusing point 212a formed by the light component having a parallel polarization is different from the focusing point 213a formed by the light component having a perpendicular polarization, along the axis 1 of the optical lens system.

Figure 5A:
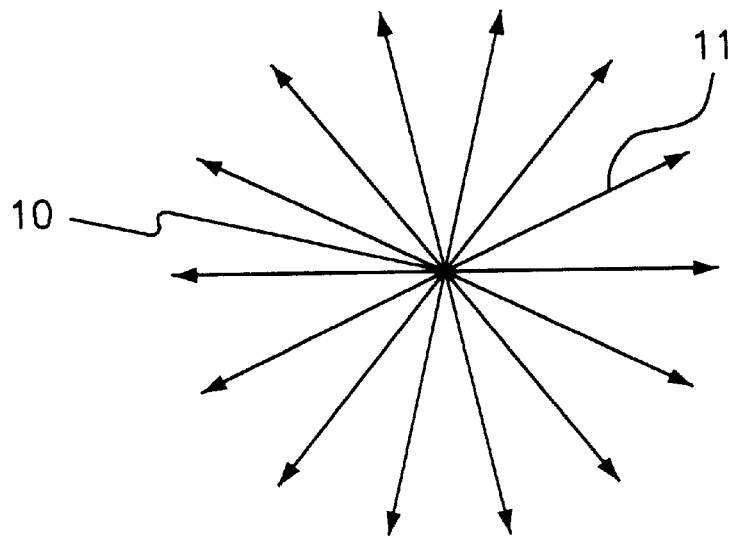
FIG. 5 is a schematic diagram illustrating a polarization component of light which can be resolved into two subcomponents.
Figure 5B:
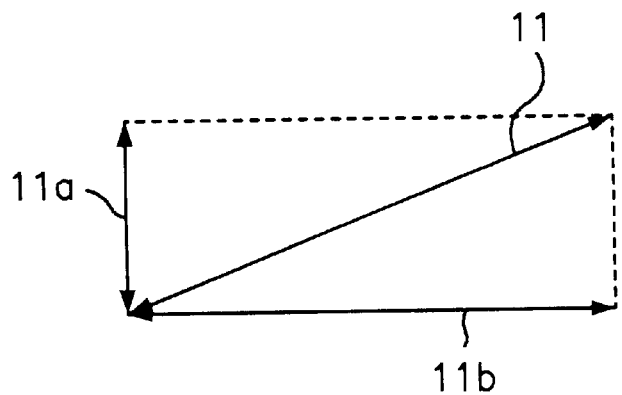
Figure 6:
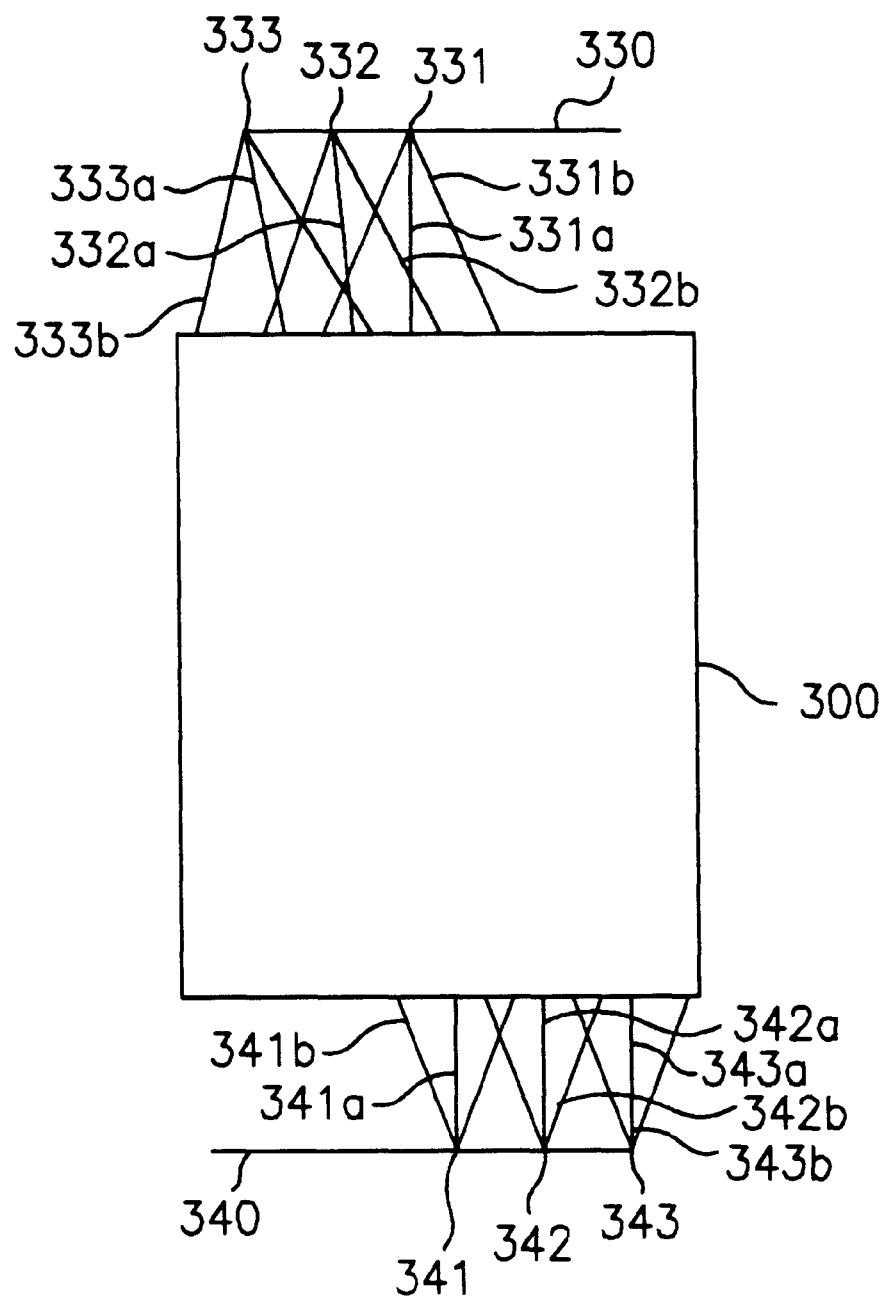
FIG. 6 is a schematic diagram illustrating the characteristics of a telecentric optical lens system used in a lithography apparatus.

Referring to FIG. 5A, a light 10 includes a plurality of polarized light components 11. As shown in FIG. 5B, the polarized light component 11 can be resolved into two subcomponents 11a and 11b. If the subcomponent 11a is a light component having a perpendicular polarized light 213 and the subcomponent 11b is a light component having a parallel polarized light 212, every other light components of the light 10 can be resolved into these two light components 11a and 11b.

Referring again to FIG. 4B, the polarized light components 11a and 11b are focused at the focusing points 213a and 212a by the birefringent unit 200, respectively. The polarized light components 11a and 11b are spread out after passing through the focusing points 213a and 212a. As described above, when the light is focused at two different focusing points 213a and 212a, the area where the light intensity is maintained over a predetermined critical value is extended in the direction of the axis of the optical lens system and decreased in the direction perpendicular to the axis thereof.

Base on this principle, the broader resolution area may be obtained in the direction of the axis of the optical lens system so that the image is obtained within an extended depth of focus 217. In other words, as shown in FIG. 3, when a photomask is exposed to a nonpolarized light 20, the incident light has the same path without the effect of the polarization while the light is passing through the isotropic optical unit 100 including the isotropic optical components 110 made of an isotropic material. However, the incident light has the effect of polarization while passing through the birefringent optical unit 200 including the birefringent optical components 210. That is, the incident light is resolved into a polarized light perpendicular to the light axis of the birefringent material and another polarized light parallel thereto. Accordingly, because the refractive indices of the birefringent optical components 210 are different from one another, the light paths are changed. After passing through the isotropic optical unit 100 including the isotropic optical components 110 made of an isotropic material, the changed light paths form the converged light flux 213b from the polarization component parallel to the optical axis of the birefringent material and the converged light flux 212b from the polarization component perpendicular to that, respectively, thereby forming the focusing points 213a and 212a in a photosensitive material 50 on a substrate 40. At this time, the isotropic optical unit 100, which is located up and down the birefringent optical unit 200, may be employed according to the optical lens system design. The features described in the present invention is irrespective of the existence of the isotropic optical unit 100. As a result, the effect of the position change of the focusing points are not based on the isotropic optical components 110 but the birefringent optical components 210.

On the other hand, recent lithography equipments have widely used a telecentric optical lens system 300 and the light from each of patterns 331, 332 and 333 located on a photomask 330 is transmitted to each of focusing points 341, 342 and 343 on an image surface 340 of the photosensitive material through an optical lens system. The center lines of the light flux 331b, 332b and 333b from the light passing through the telecentric optical lens system 300 are represented as reference numerals 331a, 332a and 333a. These center lines 331a 332a and 333a, except for the pattern 331 in the center of the photomask 330, are not parallel to the optical axis of the telecentric optical lens system 300, the center lines 341, 342 and 343 of light flux 341b, 342b and 343b, which are converged into the focusing points 341, 342 and 343, are parallel to the optical axis. This is one of features of the telecentric optical lens system 300. Accordingly, in the telecentric optical lens system 300, the center of the focusing point is always spaced out a distance apart from the focusing point 341 in which the axis of the optical lens system crosses the image surface 340. If several images are overlapped in the direction of the optical axis, an excellent image can be obtained without a change of the image, even though the focusing points are lightly different form one another in their positions. Therefore, in case where the birefringent material according to the present invention is applied to this telecentric optical lens system 300, the focusing points of the photomask image pattern to be projected into the photosensitive material are repeatedly focused along the optical axis of the optical lens system with the extension of the depth of focus and the high resolution and without the change of the image.

As apparent form the above, the present invention extends the depth of focus by providing the birefringent material to the optical lens system and enhances the resolution, thereby increasing the yield on semiconductor devices, display devices and micro-electro-mechanical systems.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A lithography apparatus comprising:
    a light source; and
    an optical lens system for projecting an image of a photomask into a photosensitive layer,
    wherein said optical lens systems includes:
        at least one isotropic optical unit for focusing a light from the light source on a focusing point; and
        a birefringent optical unit for forming dual focus on different focusing points along an axis of the optical lens system in response to polarization of the light, thereby a depth of focus being substantially increased.

2. The lithography apparatus as claimed in claim 1, wherein the light source uses an unpolarized light so that a plurality of foci are formed along the axis of the optical lens system.

3. The lithography apparatus as claimed in claim 1, wherein said light source uses a polarized light having at least one polarization direction so that a plurality of foci are formed along the axis of the optical lens system.

4. The lithography apparatus as claimed in claim 1, wherein said light source uses a polarized light having circular polarization so that a plurality of foci are formed along the optical lens system.

5. The lithography apparatus as claimed in claim 1, wherein said light source uses a polarized light having a polarization direction at an angle of 45 degrees to the direction of the axis of said birefringent optical unit so that a plurality of foci are formed along the axis of the optical lens system.

6. The lithography apparatus as claimed in claim 1, wherein the birefringent optical unit is made of crystal, calcite, mica or birefringent polymer.

7. The lithography apparatus as claimed in claim 1, wherein the birefringent optical unit includes a parallel plate, a lens, a prism or an optical wedge.

8. The lithography apparatus as claimed in claim 1, further comprising:
    at least one isotropic optical unit for compensating an error in an angle of the light through the birefringent optical unit.

9. The lithography apparatus as claimed in claim 1, wherein one of the dual focusing points is formed by a parallel polarization of the light and the other is formed by a perpendicular polarization of the light.

10. The lithography apparatus as claimed in claim 1, wherein an area where a light intensity is maintained over a predetermined value is extended in an axis direction of the optical lens system and decreased in a perpendicular direction to the axis direction thereof when the light is focused on the different focusing points.

* * * * *